United States Patent [19]

Ito et al.

[11] Patent Number: 4,916,700
[45] Date of Patent: Apr. 10, 1990

[54] SEMICONDUCTOR STORAGE DEVICE

[75] Inventors: Kazuya Ito, Kodaira; Katsutaka Kimura, Tokyo; Kazuyuki Miyazawa, Iruma, all of Japan

[73] Assignee: Hitachi, Ltd., Tokyo, Japan

[21] Appl. No.: 156,897

[22] Filed: Feb. 17, 1988

[30] Foreign Application Priority Data

Feb. 27, 1987 [JP] Japan .................. 62-42512

[51] Int. Cl.$^4$ .......................... G06F 11/16
[52] U.S. Cl. .................. 371/21.1; 371/21.2; 365/201
[58] Field of Search ............ 371/21, 24, 71, 21.1, 371/21.2; 365/201; 324/73 R, 73 AT

[56] References Cited

U.S. PATENT DOCUMENTS

| | | | |
|---|---|---|---|
| 4,313,199 | 1/1982 | Aichelmann | 371/21 |
| 4,464,750 | 8/1984 | Tatematsu | 371/21 |
| 4,541,090 | 9/1985 | Shiragasalia | 371/21 |
| 4,654,849 | 3/1987 | White | 371/21 |
| 4,656,610 | 4/1987 | Yoshida | 371/21 X |
| 4,667,330 | 5/1987 | Kumagai | 371/24 X |
| 4,744,061 | 5/1988 | Takemae | 365/201 |
| 4,752,929 | 6/1988 | Kantz | 371/21 |

*Primary Examiner*—Jerry Smith
*Assistant Examiner*—Robert W. Beausoliel
*Attorney, Agent, or Firm*—Antonelli, Terry & Wands

[57] ABSTRACT

A semiconductor storage device is disclosed which has a plurality of common data lines for delivering information from plural memory cells selected out of a plurality of memory cells during a normal operation mode, a plurality of amplifier circuits provided corresponding to the plurality of common data lines, a plurality of first testing logical circuits each one of which is provided for plural amplifier circuits which are disposed in close vicinity to each other of the plurality of amplifier circuits, and a second testing logical circuit for receiving each of output signals from the plurality of first testing logical circuits during the testing mode.

37 Claims, 5 Drawing Sheets

SEMICONDUCTOR STORAGE DEVICE

BACKGROUND OF THE INVENTION

The present invention relates to a semiconductor storage device and, more particularly, to a technique especially effective for use in a dynamic RAM having a plurality of memory arrays.

There is the so-called one-bit output type dynamic RAM having a plurality of memory arrays and adapted to selectively provide signals from such memory arrays through an output terminal. Such a dynamic RAM is provided with a set of complementary common data lines corresponding to each memory array and a main amplifier corresponding to each set of the complementary common data lines.

As to the aforesaid one-bit output type dynamic RAM, descriptions are given, for example, in "HITACHI IC Memory Data Book", pages 314-320, issued by Hitachi, Ltd. in September, 1983.

With the progress in technology to provide larger capacity in such a dynamic RAM and from the resulted necessity for securing quantities of read out signal from the memory cells to be output to the data lines, such a method is employed that the memory array is divided in the extended direction of the data line. In FIG. 5 is shown a block diagram of a large-capacity dynamic RAM developed by the inventor in the present application prior to this invention. In this dynamic RAM, there are provided eight memory arrays M0-M7 and eight main amplifiers MA0-MA7 disposed adjacent to their corresponding memory arrays. There are also provided complementary common input/output lines CIO, $\overline{\text{CIO}}$ for connecting each of the main amplifiers and the data input/output circuit I/O and connection circuits S0-S7 for selectively connecting the complementary common input/output lines CIO, $\overline{\text{CIO}}$ and one of the main amplifiers corresponding to a specified address.

As such a dynamic RAM has become larger in its capacity, the time required for testing the memory cells has increased, and therefore, there has been proposed the multi-bit testing mode in which the same test data have been written into plural memory cells disposed at the same address of the plural memory arrays and these test data are read out simultaneously and are checked. The dynamic RAM having such a testing function is provided with a testing logical circuit TL as shown in FIG. 5. Since the testing logical circuit TL is supplied with the data simultaneously read out from the eight main amplifiers MA0-MA7, the testing logical circuit TL is provided, other than the aforesaid complementary common input/output lines CIO, $\overline{\text{CIO}}$, with complementary signal lines connecting the same and each of the main amplifiers. Therefore, the space required for accommodating these complementary lines becomes larger and the layout around the testing logical circuit becomes more complex and as a result the chip size becomes larger.

SUMMARY OF THE INVENTION

An object of the present invention is the provision of a semiconductor storage device in which the substrate layout is made effective and miniaturization of the chip size is attained.

The foregoing and other objects and novel features of the present invention will become apparent from the following description taken in conjunction with the accompanying drawings.

What is representative of the present invention disclosed herein in brief is such an arrangement that portions of a testing logical circuit corresponding to adjoining plural main amplifiers of a plurality of distributed main amplifiers are disposed as distributed testing logical circuits adjacent to the adjoining plural main amplifiers.

According to the above mentioned means, the output signal from each of the main amplifiers is subjected to a partial logical operation in the distributed testing logical circuit before it is transmitted to the testing logical circuit, and therefore, the lines between the testing logical circuit and the main amplifiers can be decreased in number. Thus, the substrate layout around the testing logical circuit can be made effective and the miniaturization of the chip size can be attained.

BRIEF DESCRIPTION OF THE DRAWINGS

FIG. 5 is a block diagram of a dynamic RAM which was investigated by the present inventor prior to this invention.

DESCRIPTION OF THE PREFERRED EMBODIMENTS

Figure 2:
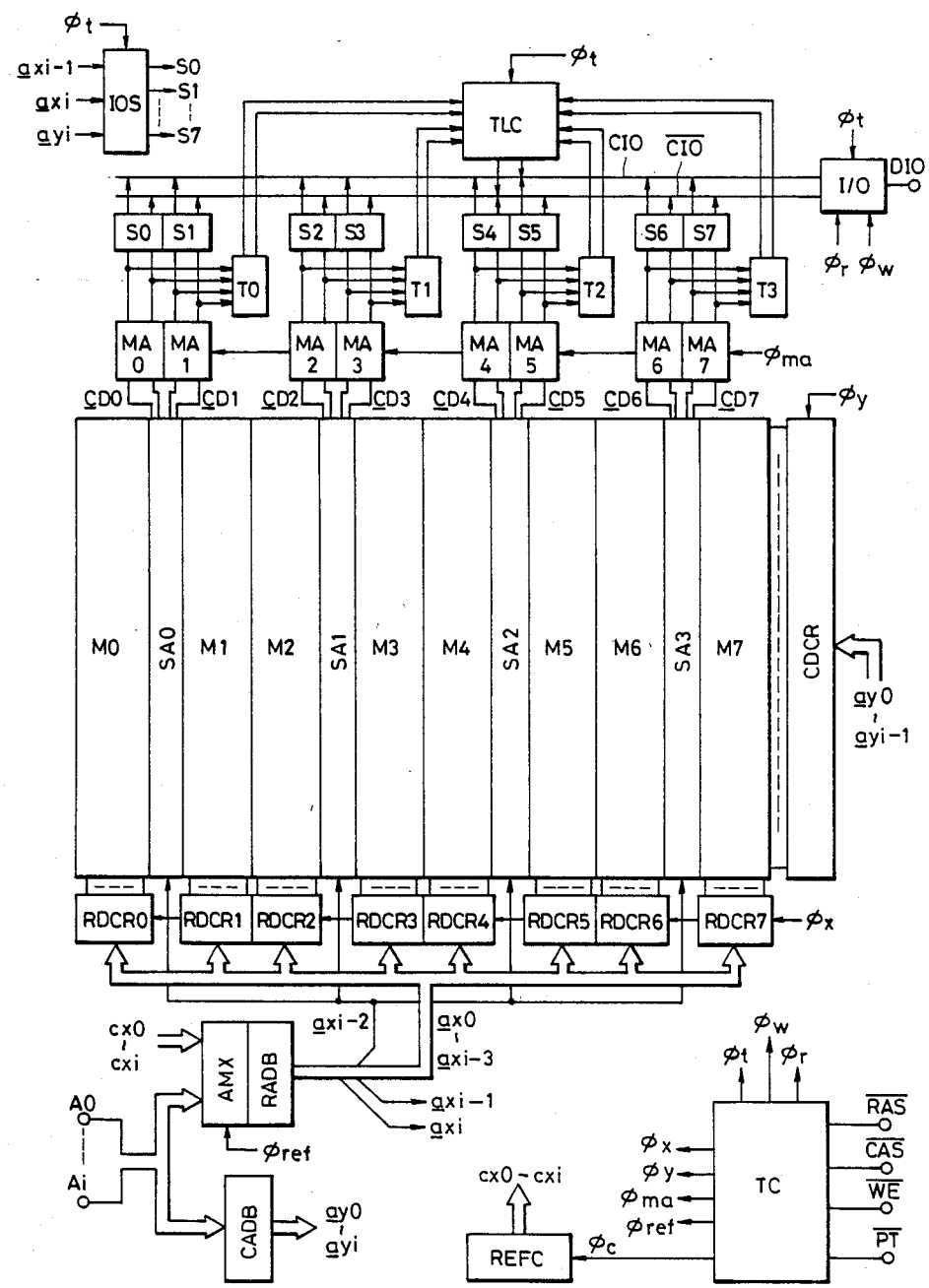
FIG. 2 is a block diagram showing an embodiment of a dynamic RAM including the testing logical circuit and distributed testing logical circuits of FIG. 1.

In FIG. 2 is shown a circuit diagram of an embodiment of the dynamic RAM to which the present invention is applied. The circuit elements in the drawing are formed, although not restrictively, on a single semiconductor substrate of monocrystalline silicon by a known semiconductor integrated circuit manufacturing technique.

The dynamic RAM is, although not restrictively, provided with four sense amplifiers SA0-SA3 and eight memory arrays M0-M7, two each thereof sandwiching each sense amplifier in between. Each sense amplifier is adapted to be selectively connected to either of the memory arrays, located on the left-hand and right-hand sides thereof, according to a complementary internal address signal axi-2 (hereinafter, for example, a noninverted internal address signal axi-2 and an inverted internal address signal $\overline{\text{axi-2}}$ together are expressed as a complementary internal address signal axi-2) supplied from a row address buffer RADB. Also, two sets each of complementary data lines are selected from each connected memory array and connected, through column switches CSW0-CSW3, not shown, to their corresponding two sets of complementary common data lines CD0-CD1-CD6-CD7 (hereinafter, for example, a noninverted signal line CD0 and an inverted signal line $\overline{\text{CD0}}$ of the complementary data lines together are expressed as a complementary data line CD0). These complementary data lines CD0-CD7 are further connected with their corresponding main amplifiers MA0-MA7.

The dynamic RAM of the present embodiment is, although not restrictively, provided with a function of multi-bit testing mode to read out one bit of stored data from each of the memory arrays M0–M7 simultaneously and make a logical comparison of the simultaneously read eight-bit data in a single unit. In this regard, the dynamic RAM is provided with a testing logical circuit TLC for processing the data read out from each of the memory arrays in the multi-bit testing mode. Furthermore, in order to reduce the number of the signal lines provided between the testing logical circuit TLC and each of the main amplifiers, there are provided four distributed testing logical circuits T0–T3.

The main amplifiers MA0–MA7 are selectively connected through the corresponding connection circuits S0–S7 with the complementary common input/output lines CIO, $\overline{CIO}$, and the complementary common input/output lines CIO, $\overline{CIO}$ in turn are connected with a data input/output circuit I/O. Adjoining ones of the main amplifiers MA0–MA7, i.e., main amplifiers MA0–MA1, MA2–MA3, MA4–MA5, and MA6–MA7 are each connected with the corresponding distributed testing logical circuits T0–T3, and these distributed testing logical circuits T0–T3 in turn are connected through the corresponding complementary data lines with the testing logical circuit TLC and via the testing logical circuit TLC are coupled to the input/output lines CIO, $\overline{CIO}$ and in turn to the input/output circuit I/O.

The connection circuits S0–S7 are controlled by select signals s0–s7 supplied from an input/output select circuit IOS. The input/output select circuit IOS is supplied with complementary internal address signals axi-1, axi, and ayi from the row address buffer $\overline{RADB}$ and column address buffer CADB. The input/output select circuit IOS decodes these complementary internal address signals and provides aforementioned select signals s0–s7. That is, in the normal read operation of the dynamic RAM, one of the select signals s0–s7 is selectively brought to a high level, whereby one main amplifier corresponding to the memory array including the specified memory cell is selected and connected to the complementary common input/output lines CIO, $\overline{CIO}$. On the other hand, when the dynamic RAM is operated in the multi-bit testing mode, a timing signal $\phi t$ is supplied from a timing control circuit TC to the input/output select circuit IOS, to the testing logical circuit TLC, and to the data input/output circuit I/O. Responding to the timing signal $\phi t$, the select signals s0–s7 are all brought to low levels. Thus, the read out data from each of the main amplifiers are delivered through their respective distributed testing logical circuits to the testing logical circuit TLC, and further, the result of the testing performed in the testing logical circuit TLC is output through the aforementioned complementary common input/output lines CIO, $\overline{CIO}$, the data input/output circuit I/O, and a data input/output terminal DIO to an external testing apparatus.

The testing logical circuit TLC, when the eight-bit data read out from the eight memory arrays are all of logical "1", causes the data input/output circuit I/O to deliver an output signal of logical "1". Likewise, when the read out eight-bit data are all of logical "0", the testing logic circuit TLC causes the data input/output circuit I/O to deliver an output signal of logical "0". In the case where there is present even one bit of different logical output from others in the read out eight-bit data, i.e., there are mixed read out data of logical "1" and of "0", the data input/output terminal DIO is brought into a high impedance state.

Referring to FIG. 2, each of the memory arrays M0–M7 is, although not restrictively, constituted of m pieces of word lines disposed in the vertical direction in the figure, n sets of complementary data lines disposed in the horizontal direction in the figure, and m×n memory cells disposed at the intersections of these word lines and complementary data lines. Each memory cell is formed of a capacitor for storing information and a MOSFET for address selection in a series configuration not shown. While signal lines forming each complementary data line are connected with input/output nodes of m memory cells arranged with predetermined regularity on the corresponding row, each word line is connected with gates of address selecting MOSFETs of n memory cells arranged on the corresponding column.

Each of the complementary data lines constituting the memory arrays M0–M7 is connected to its corresponding unit circuit of the sense amplifiers SA0–SA3 through a switch MOSFET not shown. The gate of such a MOSFET is supplied with the noninverted internal address signal axi-2 or inverted internal address signal $\overline{axi-2}$ from the row address buffer RADB. Thereby, when the internal address signal axi-2 is of logical "0", i.e., the inverted internal address signal $\overline{axi-2}$ is at high level, the complementary data lines of the memory arrays M0, M2, M4, and M6 which are disposed on the left-hand side of the sense amplifiers each are connected to the corresponding unit circuits of the respective sense amplifiers SA0, SA1, SA2, and SA3. On the other hand, when the internal address signal axi-2 is of logical "1", i.e., the noninverted internal address signal axi-2 is at high level, the complementary data lines of the memory arrays M1, M3, M5, and M7 which are disposed on the right-hand side of the sense amplifiers each are connected to the corresponding unit circuits of the respective sense amplifiers SA0, SA1, SA2, and SA3.

Each unit circuit of the sense amplifier SA0–SA3 is selectively connected with its corresponding complementary data line CD0–CD7 through a corresponding switch MOSFET of the column switch CSW0–CSW3, not shown, provided corresponding to the sense amplifier SA0–SA3. More particularly, for example, an even-numbered unit circuit of the sense amplifier SA0 is connected with the complementary data line CD0 through an even-numbered switch MOSFET of the column switch CSW0, and an odd-numbered unit circuit of the sense amplifier SA0 is connected with the complementary data line CD1 through an odd-numbered switch MOSFET of the column switch CSW0. That is, two sets of complementary data lines disposed on the adjoining rows of the selected memory arrays M0 or M1 are alternately connected to the complementary data lines CD0 and CD1.

The gates of the two switch MOSFETs corresponding to the complementary data lines disposed on the adjoining rows of the column switches CSW0–CSW3 are connected in common and are supplied with a select signal of their corresponding data line from a column address decoder CDCR. Such data line select signals, each thereof being commonly supplied to the switch MOSFETs on the same column of the column switches CSW0–CSW3, are transmitted through n/2 pieces of signal lines formed of aluminum layer and disposed parallel to the data lines.

Each unit circuit of the sense amplifier circuit SA0–SA3, rendered operative by a timing signal $\phi$ pa not shown supplied from the timing control circuit TC, amplifies a minute signal read out and output to the corresponding complementary data lines from the memory cell coupled with the selected word line and makes it into a binary signal at high level/low level.

Two sets each of the complementary data lines selected in each memory array are connected with their corresponding complementary common data line CD0–CD7 at the point in time when the amplification by the sense amplifier SA0–SA3 has been completed. Thereby, the binary read out signal, amplified by each sense amplifier, is transmitted to the corresponding main amplifier MA0–MA7.

In the read operation mode or the multi-bit testing mode of the dynamic RAM, the main amplifier MA0–MA7 is rendered operative by a timing signal $\phi$ ma supplied from the timing control circuit TC and further amplifies the binary read out signal output from its corresponding sense amplifier. In the write operation mode, on the other hand, the main amplifier MA0–MA7 of the dynamic RAM transmits the write signal supplied from the data input/output circuit I/O through the complementary common input/output lines CIO, $\overline{CIO}$ to the corresponding complementary data lines CD0–CD7.

As described in the foregoing, the dynamic RAM according to the present embodiment is provided with four distributed testing logical circuits T0–T3 disposed adjacent to the adjoining main amplifiers MA0–MA1, MA2–MA3, MA4–MA5, and MA6–MA7. The output terminals of each of the main amplifiers are connected with the respective distributed testing logical circuits T0–T3. The distributed testing logical circuits T0–T3 in turn are connected with the testing logical circuit TLC. On the other hand, the main amplifiers MA0–MA7 are selectively connected through connection circuits S0–S7 provided corresponding thereto with the complementary common input/output lines CIO, $\overline{CIO}$ during a normal read operation.

The connection circuits S0–S7 each are formed of two sets of clocked inverter circuits, for example, receiving a noninverted output signal and an inverted output signal from the corresponding main amplifier MA0–MA7 as the data input signal and receiving the select signals s0–s7 from the input/output select circuit IOS as the clock signal. The connection circuit S0–S7, when its corresponding select signal s0–s7 is at high level, transmits the output signal of the corresponding main amplifier associated therewith of main amplifiers MA0–MA7 to the complementary common input/output lines CIO, $\overline{CIO}$.

The input/output select circuit IOS is supplied with the complementary internal address signals axi-1, axi, and ayi from the row address buffer RADB and column address buffer CADB and with the timing signal $\phi$ t from the timing control circuit TC. The input/output select circuit IOS decodes these complementary internal address signals and selectively brings one of the select signals s0–s7 corresponding thereto to high level. In the multi-bit testing mode of the dynamic RAM when the timing signal $\phi$ t is turned to high level, the select signals s0–s7 are all turned to low level.

The distributed testing logical circuits T0–T3 each include two sets of AND circuits as described later. One of these AND circuits is supplied with noninverted output signals from the corresponding two main amplifiers and its output signal is made into the noninverted output signal of the distributed testing logical circuits and, the other AND circuit is supplied with inverted output signals from the corresponding two main amplifiers and its output signal is made into the inverted output signal of the distributed testing logical circuit. That is, the noninverted output signal of each of the distributed testing logical circuits goes to high level when output signals from the corresponding two main amplifiers are both of logical "1" and the inverted output signal of each of the distributed testing logical circuits goes to high level when output signals from the corresponding two main amplifiers are both of logical "0". When the output signals of the corresponding two main amplifiers are different, both the noninverted output signal and the inverted output signal of each distributed testing logical circuit are brought to low level.

The testing logical circuit TLC includes two sets of four-input AND circuits as described later. One of these AND circuits is supplied with the noninverted output signals from the aforesaid distributed testing logical circuits T0–T3 and its output signal is made into the noninverted output signal of the testing logical circuit TLC. This noninverted output signal is output through the corresponding output buffer BH to the noninverted signal line CIO of the complementary common input/output lines. The other AND circuit is supplied with the inverted output signals from the aforesaid distributed testing logical circuits T0–T3 and its output signal is made into the inverted output signal of the testing logical circuit TLC. This inverted output signal is output through the corresponding output buffer BL to the inverted signal line $\overline{CIO}$ of the complementary common input/output lines. When the output signals of the two AND circuits are both at low level, that is, when there are logical "0" and logical "1" mixed in the read out data output through the main amplifiers MA0–MA7, the outputs of the output buffers BH and BL are both held at low level.

Detailed description of the particular circuit configurations and operations of the distributed testing logical circuits T0–T3 and the testing logical circuit TLC will be given later.

The data input/output circuit I/O includes a data input buffer DIB and a data output buffer DOB which are not shown.

In the write operation mode of the dynamic RAM, the data input buffer DIB of the data input/output circuit I/O is selectively rendered operative according to a timing signal $\phi$ w supplied from the timing control circuit TC. At this time, the data input buffer DIB converts write data supplied through the input/output terminal DIO into complementary write signals and transmits the same to the complementary common input/output lines CIO, $\overline{CIO}$. These complementary write signals are transmitted through their corresponding connection circuits S0–S7, main amplifiers MA0–MA7, and the complementary common data lines CD0–CD7 to the selected memory cell. When the timing signal $\phi$ w is brought to low level, the output of the data input buffer DIB of the data input/output circuit I/O is brought into a high impedance state.

On the other hand, the data output buffer DOB of the data input/output circuit I/O, in the read operation mode and the multi-bit testing mode of the dynamic RAM, is selectively rendered operative according to timing signals $\phi$ r and $\phi$ t. At this time, the data output buffer circuit DOB outputs the read out data delivered from the memory cell selected through the complementary common input/output lines CIO, $\overline{CIO}$ to an external apparatus through the input/output terminal DIO. When both the timing signals $\phi$ r and $\phi$ t are brought to low level, the output of the data output buffer DOB is brought into a high impedance state. Even when the timing signal $\phi$ t is turned to high level, if the noninverted output signal and the inverted output signal of the testing logical circuit TLC are both turned to low level, the output of the data output buffer DOB is brought into a high impedance state. Thereby, the testing apparatus externally connected with the dynamic RAM is enabled to detect the fact that all the data read out from the eight memory arrays M0–M7 are not in conformity, i.e. there is an inequality of the logical data read out.

The column address decoder CDCR decodes the complementary internal address signal ay0–ayi-1 so as to generate the aforementioned data line select signal according to a data line select timing signal $\phi$ y supplied from the timing control circuit TC and supplies the same to the column switch CSW0–CSW3.

The column address buffer CADB receives Y address signals AY0–Ayi supplied through external terminals A0–Ai, generates complementary internal address signals ay0–ayi-1, and supplies the same to the column address decoder CDCR. In the dynamic RAM according to the present embodiment, the Y address signals AY0–AYi for specifying the column address and the X address signals AX0–AXi for specifying the row address are supplied from the external terminals A0–Ai in a time division manner, i.e., the address multiplex system is adopted. Therefore, the X address signals AX-0–AXi are supplied in synchronism with the fall of a row address strobe signal $\overline{RAS}$ supplied from the outside as a control signal and the Y address signals AY-0–AYi are supplied in synchronism with the fall of a column address strobe signal $\overline{CAS}$. For the sake of this, the column address buffer CADB takes in the Y address signals AY0–AYi supplied from the external terminals A0–Ai in accordance with a timing signal $\phi$ ac (not shown) generated by the timing control circuit TC upon detection of the fall of the column address strobe signal $\overline{CAS}$, retains the same, and generates complementary internal address signals ay0–ayi. Of the complementary internal address signals, the complementary internal address signals ay0–ayi-1 are supplied to the aforesaid column address decoder CDCR and the complementary internal address signal ayi is supplied to the aforesaid input/output select circuit IOS.

On the other hand, the word lines of the memory arrays M0–M7 are connected with the row address decoder RDCR0–RDCR7 provided corresponding to the memory arrays and one word line is selected from each thereof.

The row address decoders RDCR0–RDCR7 decode the complementary internal address signals ax0–axi-3 supplied from the row address buffer RADB and, in accordance with a timing signal $\phi \times$ supplied from the timing control circuit TC, brings one specified word line of their corresponding memory arrays into a selected state. As described above, two memory cells to which adjoining row addresses are assigned of the n memory cells connected to each of the selected word lines are connected to their corresponding common complementary data lines CD0–CD7.

The row address buffer $\overline{RADB}$ receives row address signals supplied from an address multiplexer AMX, retains the same, and generates complementary internal address signals ax0–axi. Of these complementary internal address signals, the internal address signals ax0–axi-3 are supplied commonly to the row address decoders RDCR0–RDCR7 and the complementary internal address signal axi-2 is supplied commonly to the sense amplifiers SA0–SA3. And the complementary internal address signals axi-1–axi are supplied to the input/output select circuit $\overline{IOS}$.

The dynamic RAM according to the present embodiment is provided with an automatic refresh mode in which the stored data in the memory cell is read out and rewritten within a predetermined period. In order that the word line to be refreshed is specified in the automatic refresh mode, there is provided a refresh address counter REFC. The address multiplexer AMX, in accordance with a timing signal $\phi$ ref supplied from the timing control circuit TC, selects the X address signals AX0–AXi supplied through the external terminals A0–Ai and refresh address signals cx0–cxi supplied from the refresh address counter REFC and outputs the same as row address signals to the row address buffer RADB. That is, the same, in an ordinary memory access mode when the timing signal $\phi$ ref is brought to low level, selects the X address signal AX0–AXi supplied from the external apparatus through the external terminals A0–Ai, and in the automatic refresh mode when the timing signal $\phi$ ref is brought to high level, selects the refresh address signal cx0–cxi output from the refresh address counter REFC.

The X address signals AX0–AXi are supplied in synchronism with the fall of the row address strobe signal $\overline{RAS}$ supplied from the outside as a control signal. For the sake of this, the row address buffer RADB takes in the row address signal in accordance with a timing signal $\phi$ ar (not shown) generated upon detection of the fall of the row address strobe signal $\overline{RAS}$ by the timing control circuit TC.

The refresh address counter REFC, in the automatic refresh mode of the dynamic RAM, counts a timing signal $\phi$ c supplied from the timing control circuit TC and specifies the address of the word line to be refreshed.

The timing control circuit TC in response to signals supplied as control signals from the outside, such as row address strobe signal $\overline{RAS}$, column address strobe signal $\overline{CAS}$, write enable signal $\overline{WE}$, and read testing mode signal $\overline{PT}$, generates the aforesaid various timing signals and supplies the same to each of the circuits.

Figure 1:
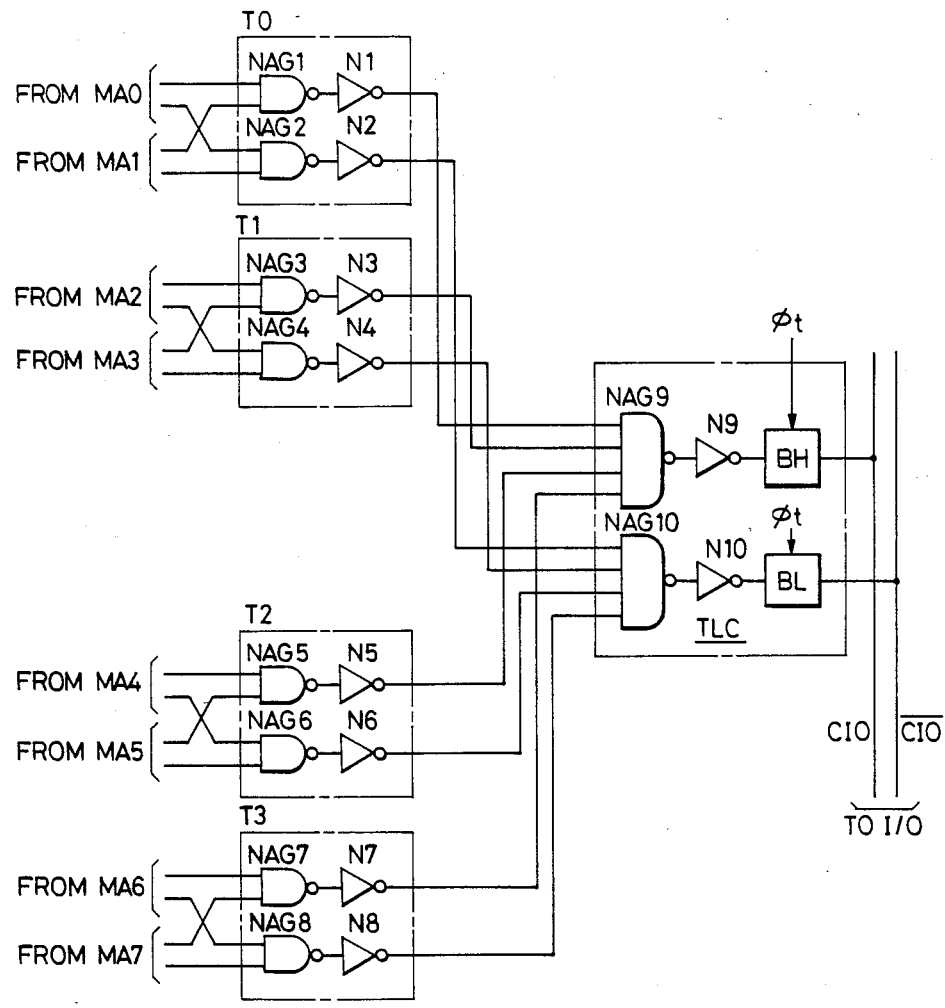
FIG. 1 is a circuit diagram showing a testing logical circuit and distributed testing logical circuits for a dynamic RAM as an embodiment to which the present invention is applied.

Referring to FIG. 1, there is shown a circuit diagram of an embodiment of the testing logical circuit TLC and the distributed testing logical circuits T0–T3 of the dynamic RAM of FIG. 2.

As describe above, the dynamic RAM of the present embodiment is provided with a multi-bit testing mode. In this multi-bit testing mode, the test data written in the memory cells of eight bits are simultaneously read out in a single unit each time. The test data of eight bits read out from the eight memory arrays M0–M7, respectively, are first checked in pairs of bits thereof in respective ones of the distributed testing logical circuits T0–T3, each pair of bits being associated with bits of information read out by adjoining main amplifiers; and then are tested for all the bits thereof in the testing logical circuit TLC so as to determine if their logical outputs are in conformity, i.e. as to whether there is a logical equality or inequality of the read out test data. As a consequence of the foregoing, when the read out eight-bit test data are all of logical "0", the testing logical circuit TLC delivers an output signal of logical "0" to the testing apparatus through the data input/output circuit I/O and the input/output terminal DIO. When the read out eight-bit test data are all of logical "1", an output signal of logical "1" is similarly output to the testing apparatus. And, when there are data of logical "0" and logical "1" are mixed in the read out eight-bit test data, the testing logical circuit TLC brings the input/output terminal DIO into a high impedance state.

In FIG. 1, the distributed testing logical circuit T0-T3 is constituted of two sets of AND circuits each thereof being formed of a NAND gate circuit and an inverter circuit. That is, one of the AND circuit of the distributed testing logical circuit T0 is formed of a NAND gate circuit NAG1 and an inverter circuit N1 and the other AND circuit is formed of a NAND gate circuit NAG2 and an inverter circuit N2. Likewise, two sets each of AND circuits of the distributed testing logical circuits T1-T3 are constituted of two sets each of NAND gate circuits NAG3-NAG8 and inverter circuits N3-N8.

The distributed testing logical circuits T0-T3 each are disposed adjacent to their corresponding two main amplifiers. Two input terminals of each of the respective two NAND gate circuits of a distributed testing logical circuit each are supplied with the noninverted output signals and the inverted output signals of their corresponding two main amplifiers, respectively. Namely, taking as an example the distributed testing logical circuit T0, the input terminals of the NAND gate circuit NAG1 of the distributed testing logical circuit T0 are supplied with the noninverted output signals of the main amplifiers MA0 and MA1 and the input terminals of the NAND gate circuit NAG2 thereof are supplied with the inverted output signals of the main amplifiers MA0 and MA1. Output signals of these NAND gate circuits NAG1 and NAG2 are inverted by the inverter circuits N1 and N2 and become the noninverted output signal and the inverted output signal of the distributed testing logical circuit T0, respectively. Thereby, the output signal of the inverter circuit N1, i.e., the noninverted output signal of the distributed testing logical circuit T0 goes to high level when two input signals to the NAND gate circuits NAG1, i.e., the noninverted output signals of the main amplifiers MA0 and MA1, are both at high level. This indicates that two bits of test data read out from selected two memory cells of the memory array M0 or M1 are both of logical "1". Likewise, the output signal of the inverter circuit N2, i.e., the inverted output signal of the distributed testing logical circuit T0 goes to high level when two input signals to the NAND gate circuits NAG2, i.e., the inverted output signals of the main amplifiers MA0 and MA1, are both at high level. This indicates that two bits of test data read out from selected two memory cells of the memory array M0 or M1 are both of logical "0".

The noninverted output signals and inverted output signals of the distributed testing logical circuits T1-T3 are also generated under similar logical conditions to those in the aforesaid distributed testing logical circuit T0. The noninverted output signals and inverted output signals of these distributed testing logical circuit T0-T3 are transmitted through their respective complementary signal lines to the testing logical circuit TLC.

The testing logical circuit TLC, as shown in FIG. 1, includes two sets of four-input AND circuits formed of a NAND gate circuit NAG9 and an inverter circuit N9 and of a NAND gate circuit NAG10 and an inverter circuit N10. The input terminals of these AND circuits are supplied, respectively, with the noninverted output signals and the inverted output signals of the distributed testing logical circuit T0-T3. That is, the input terminals of the NAND gate circuit NAG 9 are supplied with noninverted output signals of the distributed testing logical circuit T0-T3 and the input terminals of the NAND gate circuit NAG 10 are supplied with inverted output signals of the distributed testing logical circuit T0-T3. Output signal of the NAND gate circuit NAG9 is inverted by the inverter circuit N9. Likewise, output signal of the NAND gate circuit NAG10 is inverted by the inverter circuit N10.

The output signal of the inverter circuit N9 is supplied to the input terminal of an output buffer BH. This output buffer BH is supplied with the timing signal $\phi t$ from the timing control circuit TC. The output buffer BH of the testing logical circuit TLC is selectively brought into an operative state by the timing signal $\phi t$ going to high level and brings the noninverted signal line CIO of the complementary common input/output lines to high level when the input signal thereto, i.e., the output signal of the inverter circuit N9, is at high level. That is, the output signal of the output buffer BH is turned to high level when the input signals to the NAND gate circuit NAG9 are all at high level, i.e., when the test data read out from the memory cells selected from the memory arrays M0-M7 are all of logical "1". When the output signal of the inverter circuit N9 is at low level, the output signal of the output buffer BH is brought to low level regardless of the level of the timing signal $\phi t$. And, when the timing signal $\phi t$ is turned to low level, the output signal of the output buffer BH is brought into a high impedance state regardless of the output level of the inverter circuit N9.

The output signal of the inverter circuit N10, on the other hand, is supplied to the input terminal of an output buffer BL. This output buffer BL is equally supplied with the aforesaid timing signal $\phi t$. The output buffer BL of the testing logical circuit TLC is selectively brought into an operative state by the timing signal $\phi t$ going to high level and brings the inverted signal line $\overline{CIO}$ of the complementary common input/output lines to high level when the input signal thereto, i.e., the output signal of the inverter circuit N10, is at high level. That is, the output signal of the output buffer BL is turned to high level when the input signals to the NAND gate circuit NAG10 are all at high level, i.e., when the test data read out from the memory cells selected from the memory arrays M0-M7 are all of logical "0". When the output signal of the inverter circuit N10 is at low level, the output signal of the output buffer BL is brought to low level regardless of the level of the timing signal $\phi t$. And, when the timing signal $\phi t$ is turned to low level, the output signal of the output buffer BL is brought into a high impedance state regardless of the output level of the inverter circuit N10. The aforementioned buffers BH and BL can be structured of the known tri-state CMOS output buffers.

As described in the foregoing, the data input/output circuit I/O outputs its output signal at high level or low level when the timing signal $\phi t$ is turned to high level and the noninverted signal line CIO or the inverted output signal $\overline{CIO}$ of the complementary common input/output lines is brought to high level by the testing logical circuit TLC. That is, when the timing signal $\phi t$ is turned to high level and the noninverted signal line CIO of the complementary common input/output lines is at high level, the data input/output circuit I/O outputs the output signal at high level through the input/output terminal DIO to the external testing apparatus. However, when the timing signal $\phi t$ is turned to high level and the inverted signal line $\overline{\text{CIO}}$ of the complementary common input/output lines is simultaneously brought to high level, the data input/output circuit I/O outputs the output signal at low level through the input/output terminal DIO to the external testing apparatus. When the timing signal $\phi t$ is turned to high level and the complementary common input/output lines CIO, $\overline{\text{CIO}}$ are both brought to low level, the data input/output circuit I/O brings its output into the high impedance state.

Consequently, the external testing apparatus connected with the dynamic RAM can detect for all the eight-bit test data read out in the multi-bit testing mode to have been of logical "1" or logical "0". Namely, the testing apparatus first writes into all the memory cells of the dynamic RAM the test data whose bits are all of logical "1" or logical "0" and then executes the multi-bit testing mode. At this time, the testing apparatus judges or determines that all the selected eight-bit memory cells are normal when the output signal of the dynamic RAM and the previously written test data are of the same logical outputs. When the output signal of the dynamic RAM is, however, of the different logical output from that of the previously written test data or put in the high impedance state, the testing apparatus determines that there is something wrong in one or more of the selected eight-bit memory cells. Since the testing operation is performed concurrently for the eight bits in a single unit, the time required for the testing of all the memory cells, as a matter of course, becomes approximately one eighth of that required for testing bit by bit, and thus, a high speed testing can be achieved. Further, as described in the foregoing, portions of the testing logical circuit TLC are disposed, as distributed testing logical circuits T0–T3, distributed, in close vicinity, to each set of adjoining plural main amplifiers, such as the exemplified plurality of adjacent pairs of main amplifiers illustrated in FIG. 2. Therefore, the number of lines to be provided between the main amplifiers and the testing logical circuit TLC are decreased to half whereby the layout on the substrate around the testing logical circuit TLC can be simplified and the chip size of the semiconductor substrate can be miniaturized.

Figure 3:
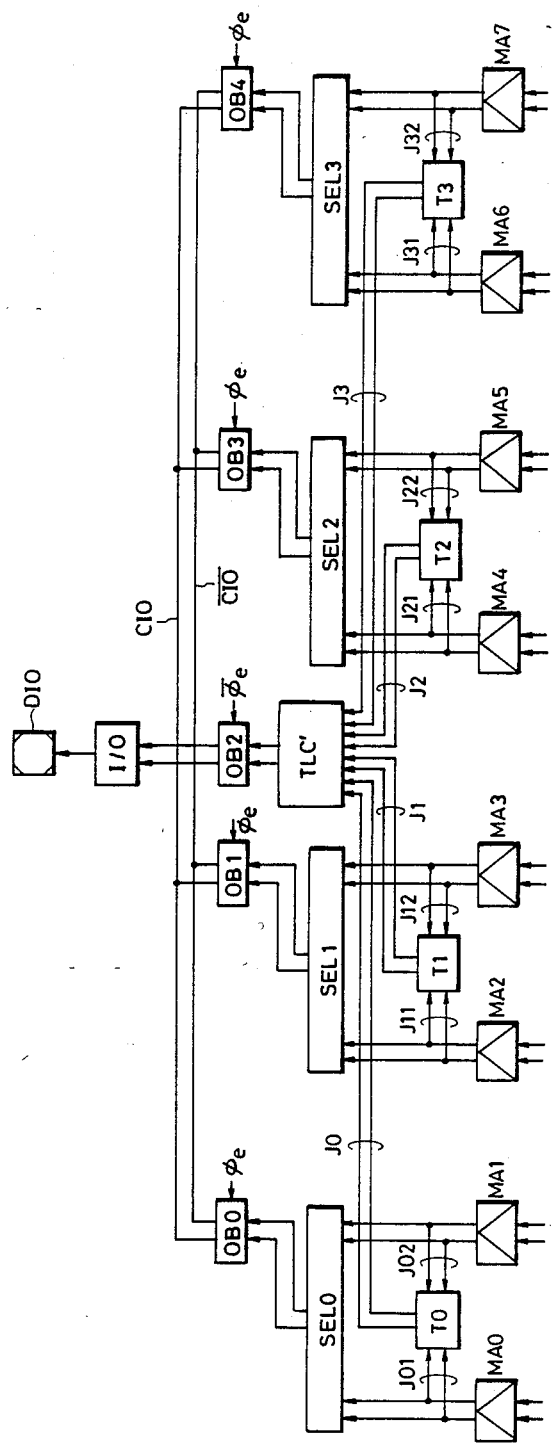
FIG. 3 is a block diagram showing an embodiment of a layout on a chip of a testing logical circuit, distributed testing logical circuits, etc. according to the present invention.

FIG. 3 shows another embodiment of the present invention. The main amplifiers MA0–MA7, distributed testing logical circuit T0–T3, and the data input/output circuit I/O shown therein have similar functions to those of the circuit blocks denoted by like reference characters in FIG. 2. The arrangement of the circuit blocks of the embodiment as shown in FIG. 3 is virtually equal to the arrangement of the circuit blocks on an actual semiconductor substrate.

A pair of output signals of the main amplifier MA0 and a pair of output signals of the main amplifier MA1 are supplied to a selector circuit SEL0 and either one of the pairs of signals are selectively delivered to an output buffer OB0. A pair of output signals of the main amplifier MA2 and a pair of output signals of the main amplifier MA3 are supplied to a selector circuit SEL1 and either one of the pairs of signals are selectively delivered to an output buffer OB1. A pair of output signals of the main amplifier MA4 and a pair of output signals of the main amplifier MA5 are supplied to a selector circuit SEL2 and either one of the pairs of signals are selectively delivered to an output buffer OB3. A pair of output signals of the main amplifier MA6 and a pair of output signals of the main amplifier MA7 are supplied to a selector circuit SEL3 and either one of the pairs of signals are selectively delivered to an output buffer OB4.

The testing logical circuit TLC' and each of the distributed testing logical circuits T0, T1, T2, and T3 are connected through pairs of lines J0, J1, J2, and J3, respectively. Output signal of the testing logical circuit TLC' is supplied to an output buffer OB2. Output signals of the output buffers OB0, OB1, OB2, OB3, and OB4 are delivered to the data input/output circuit I/O through the complementary common input/output lines CIO, $\overline{\text{CIO}}$. The selector circuits SEL0, SEL1, SEL2, and SEL3 are, although not restrictively, adapted such that a respective one thereof is put into an operative state according to a two-bit address signal and the selected pair of signals are supplied to the corresponding output buffer. Meanwhile, outputs of other three selector circuits are put into a high impedance state. The output buffers OB0, OB1, OB3, and OB4 are controlled by a control signal $\phi e$ and the output buffer OB2 is controlled by an inverted control signal $\overline{\phi e}$ of the aforesaid control signal $\phi e$. As a result therefore, when the testing logical circuit TLC' is used, only the output buffer OB2 is brought into an operative state with the outputs of the other output buffers OB0, OB1, OB3, and OB4 being placed into the high impedance state. Therefore, when the testing logical circuit TLC' is not used, only the ouput of the output buffer OB2 is brought into the high impedance state with the other output buffers OB0, OB1, OB3, and OB4 put being placed into an operative state.

According to the present embodiment, the distributed testing logical circuits T0, T1, T2, and T3 each are disposed virtually in the middle of their corresponding main amplifiers, i.e. they are disposed centrally between said corresponding main amplifiers with respect to the integrated circuit layout arrangement thereof. For example, the distributed testing logical circuit T0 is disposed at the same distances from the main amplifiers MA1 and MA2 whereby the total length of the lines provided between each of the distributed testing logical circuits and their respective main amplifiers, i.e., the lines (JO1, JO2), (J11, J12), (J21, J22), and (J31, J32), and therefore, the total wiring area required for such lines in the layout arrangement is also minimized. Further, according to the present embodiment, there is achieved in minimizing the total length of the lines J0, J1, J2, and J3 connecting the testing logical circuit TLC' with each of the distributed testing logical circuits T0, T1, T2, and T3, and therefore, in minimizing the wiring area for such lines. Namely, the testing logical circuit TLC' is disposed at virtually the same distances from the distributed testing logical circuits T1 and T2 which are located at the central portion of the distributed testing logical circuits T0, T1, T2 and T3 on a virtually straight line.

Figure 4:
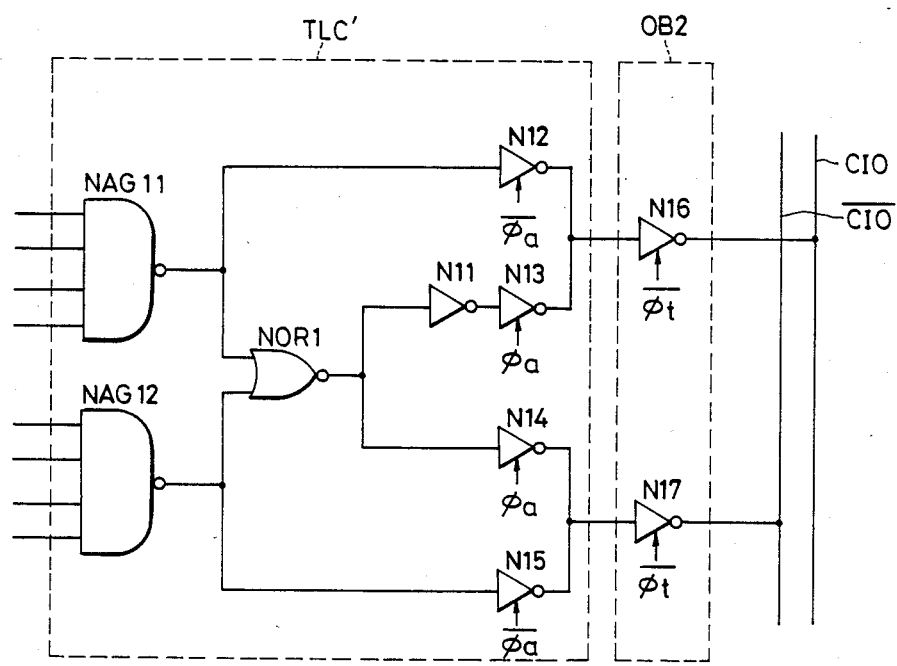
FIG. 4 is a circuit diagram showing an embodiment of the testing logical circuit TLC' shown in FIG. 3.

FIG. 4 shows an embodiment of the testing logical circuit TLC' and the output buffer OB2. An AND circuit formed of a NAND gate NAG11 and an inverter N12 corresponds to the AND circuit formed of the NAND gate NAG9 and the inverter N9 in FIG. 1. An AND circuit formed of a NAND gate NAG12 and an inverter N15 in FIG. 4 corresponds to the AND circuit formed of the NAND gate NAG10 and the inverter N10 in FIG. 1. In the testing logical circuit TLC', there are provided a NOR gate NOR1 to which output signals of the NAND gates NAG11 and NAG12 are supplied as inputs signals thereto, an inverter N14 for producing the inverted level of the output signal level of the NOR gate NOR1, and inverters N11, N13 for producing the noninverted level of the aforesaid output signal level. Operations of the aforementioned inverters N13 and N14 are controlled by a control signal $\phi a$ and operations of the aforementioned inverters N12 and N15 are controlled by a control signal $\overline{\phi a}$. Consequently, during the period when the inverters N13 and N14 are rendered operative, the outputs of the inverters N12 and N15 are held in the high impedance state. Conversely, during the period when the inverters N12 and N15 are rendered operative, the outputs of the inverters N13 and N14 are held in the high impedance state. The output signal level of the NOR gate NOR1 goes to high level only in the error mode when the output signals of the NAND gates NAG11 and NAG12 are both at low level. In the other detection modes, that is, in the normal mode in which the output signal of at least one of the NAND gates NAG11 and NAG12 goes to high level, the output signal level of the NOR gate NOR1 goes to low level. Accordingly, in the case where two-valued detection only as to whether or not there is an error is to be made, the detection circuit constituted of the aforementioned NOR gate NOR1 and the inverters N11, N13, and N14 is employed. And in the case where three-valued detection for detecting either of the two kinds of normal modes (all bits at "1" or all bits at "0") or the error state is to be made, the detection circuit constituted of the inverters N12 and N15 is employed. In the case where the two-valued detection circuit is used, the high impedance state of the output terminal DIO is not detected, and so, the detection device can be made relatively simpler.

As shown in the above described embodiments, when the present invention is applied to a semiconductor storage device such as a dynamic RAM provided with the multi-bit testing mode, the following effects can be obtained:

(1) By such distributed arrangement of portions of testing logical circuit corresponding to adjoining plural main amplifiers of a plurality of distributed main amplifiers, as distributed testing logical circuits, adjacent to the adjoining plural main amplifiers and transmission of output signals from the main amplifiers to the testing logical circuit after subjecting the same to partial logical operations in the distributed testing logical circuits, the effect is obtained that the number of signal lines between the main amplifiers and the testing logical circuit can be decreased.

(2) From the feature of (1) above, the effect is obtained that the layout on the substrate around the testing logical circuit can be made simpler and more effective.

(3) From the features of (1) and (2) above, the effect is obtained that the chip size of the semiconductor substrate on which a dynamic RAM provided with a multi-bit testing mode or the like are disposed can be miniaturized.

Although the invention made by the present inventor has been described as related to its preferred embodiments with a certain degree of particularity, it is apparent that the present invention is not restricted to the above mentioned embodiments but various modifications can be made without departing from the scope of the invention. For example, the logic in the distributed testing logical circuits T0-T3 and testing logical circuit TLC can be changed so that the output of the data input/output circuit I/O may go to high level when the memory cells are normal (all the read out data are of logical "0" or logical "1") but otherwise the output may go to low level. Or, the logic in the distributed testing logical circuits T0-T3 and testing logical circuit TLC can be changed so that an expected value (the value to be read out from normal memory cells and equal to the written data) is input from the testing apparatus to the distributed testing logical circuits T0-T3 so as to be compared with the read out data therein. For the sake of this, the expected value as well as the outputs of the main amplifiers MA are supplied to the distributed testing logical circuits T0-T3. It may also be arranged such that the data input/output circuit I/O outputs the expected value as it is when the data are in conformity as the result of the comparison, or it outputs the inverted signal of the expected value when they are not in conformity. The form of logic in the distributed testing logical circuits T0-T3 and testing logical circuit TLC in FIG. 1 may be changed to the negative logic and the AND circuits may be replaced with OR circuits. Thus, the contents and method of the testing are not subject to restriction by the described embodiments. In the present embodiment, the output signals of the distributed testing logical circuits T0-T3 are directly input to the testing logical circuit TLC, but it may be arranged such that these output signals from adjoining plural distributed testing logical circuits are further subjected to partial logical operations in distributed testing logical circuits which are also disposed in the vicinity, and thereafter, the signals are input to the testing logical circuit TLC, whereby the number of lines entering the testing logical circuit TLC can further be reduced. In the dynamic RAM in FIG. 2, in the case where the testing mode signal PT is unable to be provided singly, it may be arranged such that the multi-bit testing mode is specified by having the input level of a specific external terminal raised to as high a voltage as +12 V, or by having the row address strobe signal $\overline{RAS}$, column address strobe signal $\overline{CAS}$, and the write enable signal $\overline{WE}$ put into specific temporal relationships. Further, the number of the memory arrays may be made larger than eight, and thus, the specific construction of blocks as well as the combination of the address signals and control signals of the dynamic RAM as shown in FIG. 2 may take various forms of embodiment.

Although the invention made by the present inventor has been described relative to the case where it is applied to a dynamic RAM which was the field of utilization constituting the background of the present invention, it is not limited to the same. That is, it can be applied to other semiconductor storage devices such as, for example, a static RAM. The present invention is widely applicable to semiconductor storage devices which at least have a plurality of memory arrays and the so-called multi-bit testing mode function, the function to test the performance of such a plurality of memory arrays by having a plurality of bits concurrently tested in a single unit.

What is claimed is:

1. A semiconductor storage device comprising:
   a plurality of common data lines for delivering information data from plural memory cells selected out of a plurality of memory cells;

a plurality of amplifier circuits being provided which correspond in number to the number of said plurality of common data lines and which provide output signals in accordance with data received from said common data lines, respectively;

a plurality of first testing logical circuits for providing output signals in response to the outputs of said amplifier circuits of which each one of at least one of said first testing logical circuits is coupled to plural amplifier circuits, said plural amplifier circuits being a numerical subset of said plurality of amplifier circuits; and a second testing logical circuit being coupled to said plurality of testing logical circuits and providing a corresponding test data output in accordance with the output signals received from each one of said plurality of first testing logical circuits, wherein each one of said plurality of first testing logical circuits includes input and output signal lines for inputting thereto signals outputted by said amplifier circuits and outputting therefrom corresponding output signals, and wherein the required number of output signal lines is less than the number of input signal lines for each one of said plurality of first testing logical circuits.

2. A semiconductor storage device according to claim 1, wherein each of said plurality of amplifier circuits is a main amplifier for amplifying the memory cell information delivered to the corresponding common data line.

3. A semiconductor storage device according to claim 2, wherein each of said plurality of first testing logical circuits is respectively supplied with the output signals from respective subsets of plural amplifier circuits, each subset defining two or more amplifier circuits.

4. A semiconductor storage device according to claim 3, wherein each of said plurality of common data lines is formed of a pair of data lines, whereby the memory cell information is transmitted as complementary signals.

5. A semiconductor storage device according to claim 4, wherein each one of said plurality of amplifier circuits is provided with a pair of data lines, whereby each output signal of each amplifier circuit is transmitted as complementary signals via said pair of data lines.

6. A semiconductor storage device according to claim 5, wherein each one of said plurality of first testing logical circuits includes means which detects either an equality or inequality between sets of output information data supplied thereto from said plural amplifier circuits associated therewith.

7. A semiconductor storage device according to claim 6, wherein said second testing logical circuit includes second means which detects whether or not there is equality between the sets of information from the plural memory cells selected from said plurality of memory cells based on the output signals from each one of said first testing logical circuits.

8. A semiconductor storage device according to claim 7, wherein each one of said first testing logical circuits is disposed in close proximity with the respective plural amplifier circuits associated therewith with respect to a layout arrangement of the same on a substrate.

9. A semiconductor storage device according to claim 8, wherein each said plural amplifier circuits comprises a pair of main amplifiers wherein the corresponding first testing logical circuit associated therewith is centrally disposed on said substrate between them such that the total length of the input signal lines of each one of said first testing logical circuits, which are connected to the output data lines of a corresponding pair of main amplifiers, is minimized, and wherein said second testing logical circuit is centrally disposed in the layout arrangement of said plurality of first testing logical circuit and said second testing logical circuit on said substrate so as to minimize the required total length of the wiring lines of a corresponding wiring layer connecting the output signal lines of said plurality of first testing logical circuits to the inputs of said second testing logical circuit in the layout arrangement.

10. A semiconductor storage device according to claim 9, wherein each one of said plurality of first testing logical circuits comprises a first AND logical circuit having a pair of inputs responsive to non-inverted data line signals of a corresponding pair of main amplifiers associated therewith, and a second AND logical circuit having a pair of inputs responsive to logically inverted data line signals of a corresponding pair of main amplifiers associated therewith.

11. A semiconductor storage device according to claim 10, wherein said second testing logical circuit comprises a pair of AND logical circuits which are respectively responsive to the AND logical circuits associated with the non-inverted data line signals and to the AND logical circuits associated with the logically inverted data line signals of said first testing logical circuits in response to a multi-bit testing mode timing signal which is indicative of a testing mode operation.

12. A semiconductor storage device according to claim 11, wherein each of the AND logical circuits of said plurality of first testing logical circuits and of said second testing logical circuit are comprised of a series connection of a NAND gate and an inverter logical gate.

13. A semiconductor storage device according to claim 12, wherein said second testing logical circuit further includes a NOR logical gate having a pair of inputs respectively coupled to respective outputs of the pair of NAND gates thereat and having an output selectively coupled to both an output of one of said pair of AND logical circuits through a pair of series-connected inverter logical gates and to an output of the other of said pair of AND logical circuits through a further inverter logical gate.

14. A semiconductor storage device according to claim 13, wherein the outputs of said pair of AND logical circuits are respectively selectively coupled to complementary common input/output lines of said semiconductor storage device via respective inverter logical buffer circuits during said testing mode operation and in turn to an output terminal of said semiconductor storage device via an input/output circuit thereof.

15. A semiconductor storage device according to claim 14, wherein said memory cells are of the dynamic RAM type.

16. A semiconductor storage device according to claim 14, wherein said memory cells are of the SRAM type.

17. A semiconductor storage device according to claim 14, wherein each one of said plurality of common data lines is associated with a separate array of memory cells of a matrix arrangement of rows and columns of memory cells, and wherein the number of such separate array of cells corresponds to the number of main amplifiers.

18. A semiconductor storage device according to claim 17, wherein respective pairs of separate arrays of memory cells are associated with and have disposed therebetween, in said layout arrangement on said substrate, a respective sensing amplifier arrangement which provides outputs of selected memory cells in the form of complementary binary signals to corresponding complementary data lines and which outputs are inputted to a corresponding pair of main amplifiers associated therewith.

19. A semiconductor storage device according to claim 18, wherein said memory cells are of the dynamic RAM type.

20. A semiconductor storage device comprising:
a plurality of common data lines for delivering information data from plural memory cells selected out of a plurality of memory cells;
a plurality of amplifier circuits being provided which correspond in number to the number of said plurality of common data lines and which provide output signals in accordance with data received from said common data lines, respectively;
a plurality of first testing logical circuits for providing output signals in response to the outputs of said amplifier circuits of which each one of at least one of said first testing logical circuits is coupled to plural amplifier circuits, said plural amplifier circuits being a numerical subset of said plurality of amplifier circuits; and
a second testing logical circuit being coupled to said plurality of testing logical circuits and providing a corresponding test data output in accordance with the output signals received from each one of said plurality of first testing logical circuits,
means for selectively delivering one output signal from the output signals of said plurality of amplifier circuits and the output signal of said second testing logical circuit to an output terminal,
wherein each one of said plurality of first testing logical circuits includes input and output signal lines for inputting thereto signals outputted by said amplifier circuits and outputting therefrom corresponding output signals, and wherein the required number of output signal lines is less than the number of input signal lines for each one of said plurality of first testing logical circuits.

21. A semiconductor storage device according to claim 20, wherein each of said plurality of first testing logical circuits is respectively supplied with the output signals from respective subsets of plural amplifier circuits, each subset defining two or more amplifier circuits.

22. A semiconductor storage device according to claim 21, wherein each of said plurality of common data lines is formed of a pair of data lines, whereby the memory cell information is transmitted as complementary signals.

23. A semiconductor storage device according to claim 22, wherein each one of said plurality of amplifier circuits is provided with a pair of data lines, whereby each output signal of each amplifier circuit is transmitted as complementary signals, via said pair of data lines.

24. A semiconductor storage device according to claim 23, wherein each one of said plurality of first testing logical circuits includes means which detects either an equality or inequality between sets of output information data supplied thereto from said plural amplifier circuits associated therewith.

25. A semiconductor storage device according to claim 24, wherein said second testing logical circuit includes second means which detects whether or not there is equality between the sets of information from the plural memory cells selected from said plurality of memory cells based on the output signals from each one of said first testing logical circuits.

26. A semiconductor storage device according to claim 20, wherein each one of said first testing logical circuits is disposed in close proximity with the respective plural amplifier circuits associated therewith with respect to a layout arrangement of the same on a substrate.

27. A semiconductor storage device according to claim 26, wherein each said plural amplifier circuits comprises a pair of main amplifiers wherein the corresponding first testing logical circuit associated therewith is centrally disposed on said substrate between them such that the total length of the input signal lines of each one of said first testing logical circuits, which are connected to the output data lines of a corresponding pair of main amplifiers, is minimized, and wherein said second testing logical circuit is centrally disposed in the layout arrangement of said plurality of first testing logical circuit and said second testing logical circuit on said substrate so as to minimize the required total length of the wiring lines of a corresponding wiring layer connecting the output signal lines of said plurality of first testing logical circuits to the inputs of said second testing logical circuit in the layout arrangement.

28. A semiconductor storage device according to claim 27, wherein each one of said plurality of first testing logical circuits comprises a first AND logical circuit having a pair of inputs responsive to non-inverted data line signals of a corresponding pair of main amplifiers associated therewith, and a second AND logical circuit having a pair of inputs responsive to logically inverted data line signals of a corresponding pair of main amplifiers associated therewith.

29. A semiconductor storage device according to claim 28, wherein said second testing logical circuit comprises a pair of AND logical circuits which are respectively responsive to the AND logical circuits associated with the non-inverted data line signals and to the AND logical circuits associated with the logically inverted data line signals of said first testing logical circuits in response to a multi-bit testing mode timing signal which is indicative of a testing mode operation.

30. A semiconductor storage device according to claim 29, wherein each of the AND logical circuits of said plurality of first testing logical circuits and of said second testing logical circuit are comprised of a series connection of a NAND gate and an inverter logical gate.

31. A semiconductor storage device according to claim 30, wherein said second testing logical circuit further includes a NOR logical gate having a pair of inputs respectively coupled to respective outputs of the pair of NAND gates thereat and having an output selectively coupled to both an output of one of said pair of AND logical circuits through a pair of series-connected inverter logical gates and to an output of the other of said pair of AND logical circuits through a further inverter logical gate.

32. A semiconductor storage device according to claim 35, wherein the outputs of said pair of AND logical circuits are respectively selectively coupled to complementary common input/output lines of said semiconductor storage device via respective inverter logical buffer circuits during said testing mode operation and in turn to an output terminal of said semiconductor storage device via an input/output circuit thereof.

33. A semiconductor storage device according to claim 32, wherein said memory cells are of the dynamic RAM type.

34. A semiconductor storage device according to claim 32, wherein said memory cells are of the SRAM type.

35. A semiconductor storage device according to claim 34, wherein each one of said plurality of common data lines is associated with a separate array of memory cells of a matrix arrangement of rows and columns of memory cells, and wherein the number of such separate array of cells corresponds to the number of main amplifiers.

36. A semiconductor storage device according to claim 35, wherein respective pairs of separate arrays of memory cells are associated with and have disposed therebetween, in said layout arrangement on said substrate, a respective sensing amplifier arrangement which provides outputs of selected memory cells in the form of complementary binary signals to corresponding complementary data lines.

37. A semiconductor storage device according to claim 36, wherein said memory cells are of the dynamic RAM type.

* * * * *